United States Patent
Moors et al.

(10) Patent No.: US 8,928,855 B2
(45) Date of Patent: Jan. 6, 2015

(54) LITHOGRAPHIC APPARATUS COMPRISING AN INTERNAL SENSOR AND A MINI-REACTOR, AND METHOD FOR TREATING A SENSING SURFACE OF THE INTERNAL SENSOR

(75) Inventors: Johannes Hubertus Josephina Moors, Helmond (NL); Bastiaan Theodoor Wolschrijn, Abcoude (NL); Dirk Heinrich Ehm, Lauchheim (DE)

(73) Assignees: ASML Netherlands B.V., Veldhoven (NL); Carl Zeiss SMT GmbH, Oberkochen (DE)

( * ) Notice: Subject to any disclaimer, the term of this patent is extended or adjusted under 35 U.S.C. 154(b) by 450 days.

(21) Appl. No.: 12/937,498

(22) PCT Filed: Apr. 15, 2009

(86) PCT No.: PCT/NL2009/050201
§ 371 (c)(1),
(2), (4) Date: Oct. 12, 2010

(87) PCT Pub. No.: WO2009/128717
PCT Pub. Date: Oct. 22, 2009

(65) Prior Publication Data
US 2011/0037961 A1  Feb. 17, 2011

Related U.S. Application Data

(60) Provisional application No. 61/071,156, filed on Apr. 15, 2008.

(51) Int. Cl.
G03F 7/20 (2006.01)

(52) U.S. Cl.
CPC ........ G06F 7/70933 (2013.01); G03F 7/70925 (2013.01); G06F 7/70975 (2013.01)
USPC ............................................................ 355/30

(58) Field of Classification Search
CPC . G03F 7/708; G03F 7/70808; G03F 7/70908; G03F 7/70916; G03F 7/70925; G03F 7/7095
See application file for complete search history.

(56) References Cited

U.S. PATENT DOCUMENTS 6,268,904 B1 * 7/2001 Mori et al. ...................... 355/53
7,315,346 B2   1/2008 Van Beek et al.
(Continued)

FOREIGN PATENT DOCUMENTS

EP    1 429 189 A    6/2004
JP    9-134861       5/1997
(Continued)

OTHER PUBLICATIONS

Japanese Office Action mailed Feb. 5, 2013 in corresponding Japanese Patent Application No. 2011-504949.

*Primary Examiner* — Thomas R Artman
(74) *Attorney, Agent, or Firm* — Pillsbury Winthrop Shaw Pittman LLP

(57) ABSTRACT

A lithographic apparatus includes a projection system constructed and arranged to project a beam of radiation onto a target portion of a substrate, an internal sensor having a sensing surface, and a mini-reactor movable with respect to the sensor. The mini-reactor includes an inlet for a hydrogen containing gas, a hydrogen radical generator, and an outlet for a hydrogen radical containing gas. The mini-reactor is constructed and arranged to create a local mini-environment comprising hydrogen radicals to treat the sensing surface.

13 Claims, 5 Drawing Sheets

(56) References Cited

U.S. PATENT DOCUMENTS

| | | | |
|---|---|---|---|
| 7,372,049 B2 | 5/2008 | Van Herpen et al. | |
| 7,473,908 B2 | 1/2009 | Van Herpen et al. | |
| 7,518,128 B2 * | 4/2009 | Van Herpen et al. | 250/492.2 |
| 7,868,304 B2 * | 1/2011 | Bakker et al. | 250/492.2 |
| 7,894,037 B2 | 2/2011 | Bleeker et al. | |
| 2004/0165160 A1 | 8/2004 | Van Beek et al. | |
| 2006/0072084 A1 * | 4/2006 | Van Herpen et al. | 355/30 |
| 2006/0163500 A1 * | 7/2006 | Inoue et al. | 250/493.1 |
| 2006/0175558 A1 * | 8/2006 | Bakker et al. | 250/492.2 |
| 2006/0289811 A1 * | 12/2006 | Wilhelmus Van Herpen et al. | 250/504 R |
| 2007/0125964 A1 | 6/2007 | Van Herpen et al. | |
| 2007/0146658 A1 | 6/2007 | Van Mierlo et al. | |
| 2008/0011967 A1 | 1/2008 | Van Herpen et al. | |
| 2008/0074655 A1 * | 3/2008 | Wilhelmus Van Herpen et al. | 356/237.2 |
| 2008/0083885 A1 * | 4/2008 | Wilhelmus Van Herpen et al. | 250/493.1 |
| 2009/0033889 A1 | 2/2009 | Bleeker et al. | |
| 2011/0037961 A1 * | 2/2011 | Moors et al. | 355/53 |
| 2011/0048452 A1 | 3/2011 | Zink et al. | |
| 2011/0058147 A1 * | 3/2011 | Ehm et al. | 355/30 |

FOREIGN PATENT DOCUMENTS

| | | |
|---|---|---|
| JP | 2004-200686 | 7/2004 |
| JP | 2006-529057 | 12/2006 |
| JP | 2007-194609 | 8/2007 |
| JP | 2009-517880 | 4/2009 |
| JP | 2009-544148 | 12/2009 |
| JP | 2010-534946 | 11/2010 |
| WO | 2007/064210 | 6/2007 |
| WO | 2008/002134 A2 | 1/2008 |
| WO | 2008/007952 A | 1/2008 |

* cited by examiner

LITHOGRAPHIC APPARATUS COMPRISING AN INTERNAL SENSOR AND A MINI-REACTOR, AND METHOD FOR TREATING A SENSING SURFACE OF THE INTERNAL SENSOR

CROSS-REFERENCE TO RELATED APPLICATIONS

This application claims the benefit of U.S. provisional application 61/071,156, which was filed on Apr. 15, 2008, and which is incorporated herein in its entirety by reference.

FIELD

The present invention relates to a lithographic apparatus comprising an internal sensor and a mini-reactor. The invention further relates to a method for treating a sensing surface of an internal sensor of a lithographic apparatus. The invention also relates to a device manufacturing method.

BACKGROUND

A lithographic apparatus is a machine that applies a desired pattern onto a substrate, typically onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate may be limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, having fragile surfaces. This surface is gradually degraded due to the impact, or sputtering, of the particles expelled from the plasma and the lifetime of the mirrors is thus decreased. The sputtering effect is particularly problematic for the radiation collector or collector mirror. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources may use tin (Sn) or another metal vapor to produce EUV radiation. This tin may leak into the lithographic apparatus, and be deposited on mirrors in the lithographic apparatus, e.g. the mirrors of the radiation collector. The mirrors of such a radiation collector may have a EUV reflecting top layer of, for example, ruthenium (Ru). Deposition of more than approximately 10 nm tin (Sn) on the reflecting Ru layer will reflect EUV radiation in the same way as bulk Sn. The overall transmission of the collector may decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers or traps may remove part of the debris, still some debris will deposit on the radiation collector or other optical elements.

In order to remove unwanted deposition, cleaning methods have been discussed, including for instance hydrogen radical cleaning, such as for instance described in International Patent Application Publication No. WO2008002134. In this way, $H_2$ and hydrogen radicals are introduced in at least part of the lithographic apparatus. WO2008002134 describes a cleaning arrangement for use in an EUV lithographic apparatus, for example an EUV lithographic apparatus with a Sn source. The cleaning arrangement includes a gas source for a hydrogen containing gas and a hydrogen radical source. The hydrogen radical source is a source of (UV) radiation which induces photo dissociation of the hydrogen (this could also be the EUV source) or a hot filament that generates hydrogen radicals. Radicals may reduce Sn oxides (if present) and form volatile hydrides of Sn deposition and/or carbon deposition. In this way, the cleaning arrangement can be used to clean optical elements from Sn and/or C deposition.

SUMMARY

Lithographic apparatus may comprise one or more internal sensors, which can be used for a plurality of applications, such as alignment control, dose control, image optimization, pupil viewing, spectral purity, etc. Such sensors may suffer from deposition of carbonaceous material such as, for example, carbon or hydrocarbons.

It is an aspect of the present invention to provide a lithographic apparatus comprising an internal sensor. It is a further aspect of the invention to provide a method for treating a sensing surface of an internal sensor of a lithographic apparatus. It is yet another further aspect of the invention to provide a device manufacturing method.

To that end, the present invention provides in an embodiment a lithographic apparatus comprising an internal sensor and a mini-reactor, wherein the mini-reactor is movable with respect to the sensor, wherein the sensor has a sensing surface, wherein the mini-reactor comprises an inlet for a hydrogen containing gas, a hydrogen radical generator, and an outlet for a hydrogen radical containing gas, wherein the mini-reactor is arranged to create, during use of the mini-reactor in a method for treating the sensing surface of the sensor, a local mini-environment comprising hydrogen radicals to treat the sensing surface.

According to an embodiment, there is provided a lithographic apparatus that includes a projection system constructed and arranged to project a beam of radiation onto a target portion of a substrate, an internal sensor having a sensing surface, and a mini-reactor movable with respect to the sensor. The mini-reactor includes an inlet for a hydrogen containing gas, a hydrogen radical generator, and an outlet for a hydrogen radical containing gas. The mini-reactor is constructed and arranged to create a local mini-environment comprising hydrogen radicals to treat the sensing surface.

The sensor may comprise a sensor selected from the group consisting of wafer stage sensors, mask stage sensors, detector sensors, collector sensors, collector frame sensors, illuminator sensors, illuminator frame sensors, position sensors, and energy sensors. In an embodiment the sensing surface comprises ruthenium. Herein, the term "sensor" refers to internal sensor, i.e. a sensor within the lithographic apparatus.

In an embodiment, the hydrogen radical generator may comprise a filament which is constructed and arranged to be heated in order to convert molecular hydrogen into hydrogen radicals. In an embodiment, the mini-reactor may be arranged to purge the sensing surface of the sensor. The lithographic apparatus may in an embodiment further comprise a cooling element arranged to cool at least part of the mini-reactor, especially the mini-reactor walls.

In an embodiment, the mini-reactor may comprise a reactor chamber with a chamber opening. Such reactor chamber opening may be arrangeable to the sensing surface, or the sensing surface may be arrangeable to the reactor chamber opening, or both the reactor chamber opening and the sensing surface may be arrangeable to each other, since, as mentioned above, the sensor, or the mini-reactor, or the sensor and the mini-reactor are transportable. In this way, the mini-reactor may also be able to "serve" a plurality of sensors, such as two or more sensors. For instance, the sensing surface of different sensors may be treated sequentially, either because the sensors are transported to the mini-reactor, respectively, or the mini-reactor is transported to the sensors, respectively, or the respective sensors and the mini-reactor are transported to each other.

The sensing surface may have a sensing surface area or a sensing surface cross sectional area and the reactor chamber opening may have a chamber opening area (or chamber opening cross section area). Especially, the reactor chamber opening area is substantially equal to or larger than the sensing surface area or the sensing surface cross sectional area. In this way, the cleaning position (i.e. over the sensing surface) may be nearly closed or shielded from the environment. Typically, the ratio of reactor chamber opening area and the sensing surface area or the sensing surface cross-sectional area is in the range of about 0.2-2.

The internal surface of the mini-reactor, and especially of the reactor chamber, may comprise a material that does substantially not react with hydrogen or with hydrogen radicals or with both hydrogen and hydrogen radicals, especially at the treatment conditions. In an embodiment, the internal surface of the reactor walls, especially of the reactor chamber, may comprise a material having a hydrogen radical surface recombination coefficient of ≤0.02. In an embodiment, an external part of the reactor, especially external parts of the reactor chamber, which may be arranged to be directed to part of the sensing surface and/or its surroundings, may comprise a material having a hydrogen radical surface recombination coefficient of greater than about 0.02, especially about >0.1.

According to an aspect, embodiments of the invention provide a method for treating a sensing surface of an internal sensor of a lithographic apparatus, wherein the sensor has a sensing surface, the method comprising providing a local mini-environment comprising hydrogen radicals to the sensing surface and treating the sensing surface with the hydrogen radicals.

According to an embodiment, there is provided a method for treating a sensing surface of an internal sensor of a lithographic apparatus, wherein the sensor has a sensing surface. The method comprises providing a local mini-environment comprising hydrogen radicals, and treating the sensing surface with the hydrogen radicals.

An embodiment of the invention allows for the local mini-environment to be substantially only provided to the sensing surface. In an embodiment, the method comprises at least partially cleaning the sensing surface from carbon containing deposition (also indicated as carbonaceous deposition), such as carbon deposition and/or hydrocarbon deposition. Hence, in an embodiment, the mini-reactor is arrangeable to create the local mini-environment substantially only to the sensing surface of the sensor.

In an embodiment, the hydrogen radicals may be provided by leading a hydrogen containing gas along a hot filament. The $H_2$ partial pressure, in the mini-reactor, especially within the reactor chamber, may be in the range of about 0.1-100 Pa and the hydrogen radical partial pressure may be in the range of about $10^{-5}$ to 10 Pa. In an embodiment, the hydrogen containing gas comprises one or more gasses selected from the group consisting of $H_2$, HD, $D_2$, HT, DT, and $T_2$.

The method may further comprise evaluation of a treatment result, for instance by evaluating the off-gas from the sensing surface. For instance a mass spectrometer may detect a reaction product, e.g. hydrocarbon(s). When a predetermined lower limit of hydrocarbon(s) is reached, the treatment may be terminated. Hence, the lithographic apparatus may further comprise a treatment sensor arranged to evaluate the treatment result. The method may further comprise evaluating the treated sensing surface. Depending upon the evaluation, the treatment may be continued, for instance until a certain predetermined result is obtained, such a predetermined absorption, reflection or refraction value of light impinging on the sensing surface, or the treatment may be terminated, and for instance lithographic processing (i.e. the manufacturing of devices) may be continued.

In an embodiment, the lithographic apparatus further comprises a mini-reactor (such as mentioned above), wherein the mini-reactor comprises an inlet for a hydrogen containing gas, a hydrogen radical generator, and an outlet for a hydrogen radical containing gas, wherein the mini-reactor is arranged to create (during use of the mini-reactor in the method for treating the sensing surface of the sensor) a local mini-environment comprising hydrogen radicals to the sensing surface for treating the sensing surface, and wherein the method for treating the sensing surface of the sensor comprises arranging the sensing surface to the mini-reactor, or arranging the mini-reactor to the sensing surface or arranging the sensing surface and the mini-reactor to each other, and creating the local mini-environment comprising hydrogen radicals to the sensing surface and treating the sensing surface with the hydrogen radicals.

The method of treating the sensing surface may be applied before or after manufacturing devices with the lithographic apparatus. However, an embodiment also provides in a further aspect a device manufacturing method using a lithographic apparatus, wherein the lithographic apparatus comprises a sensor comprising a sensing surface, wherein while manufacturing a device, during a manufacturing stage that the sensor is not critical during the device manufacturing method, the method for treating the sensing surface of the sensor is applied, wherein the method comprises providing a local mini-environment comprising hydrogen radicals to the sensing surface and treating the sensing surface with the hydrogen radicals.

According to an embodiment, there is provided a device manufacturing method using a lithographic apparatus. The lithographic apparatus comprises a sensor comprising a sensing surface. The method comprises patterning a beam of radiation, projecting the beam of radiation onto a target portion of a substrate, providing a local mini-environment comprising hydrogen radicals, and treating the sensing surface with the hydrogen radicals.

In an embodiment, the lithographic apparatus comprises a source of radiation constructed to generate EUV radiation wherein the source of radiation is a Sn plasma source. Herein, the term "constructed to generate EUV radiation" especially refers to sources which are designed to generate EUV radiation and which are designed to be used in EUV lithography. In specific variants, the source of radiation comprises a laser produced plasma source (LPP) or a discharge produced plasma source (Sn plasma sources), respectively.

The lithographic apparatus comprises in an embodiment an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate. In an embodiment, the lithographic apparatus is an EUV lithographic apparatus. The lithographic apparatus comprises a source of radiation constructed to generate the radiation beam, which in an embodiment may be a EUV radiation beam, and the source of radiation is constructed to generate EUV radiation.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
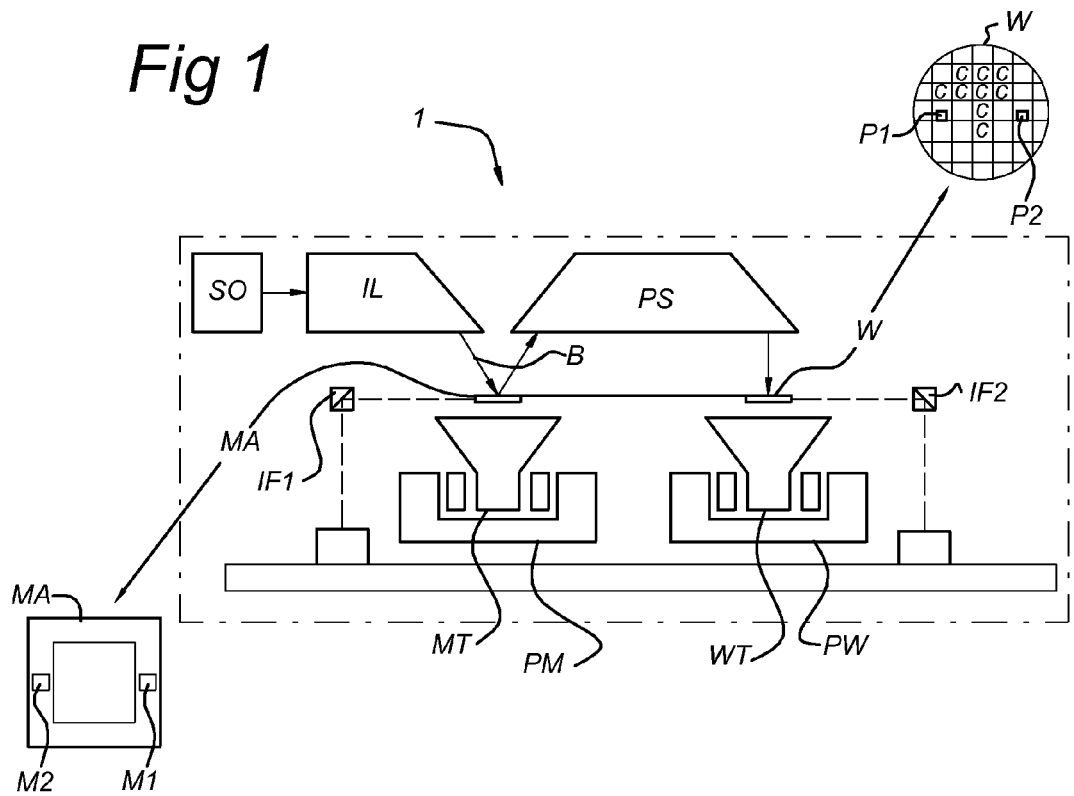
FIG. 1 schematically depicts a lithographic apparatus according to an embodiment of the present invention.

FIG. 1 schematically depicts a lithographic apparatus 1 according to an embodiment of the present invention. The apparatus 1 includes a source SO for generating radiation, an illumination system (illuminator) IL configured to condition a radiation beam B (e.g. UV radiation or EUV radiation) from the radiation received from source SO. The source SO may be provided as a separate unit. A support (e.g. a mask table) MT is configured to support a patterning device (e.g. a mask) MA and is connected to a first positioning device PM configured to accurately position the patterning device MA in accordance with certain parameters. A substrate table (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if used, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

a. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

b. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. about 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is typically also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is typically used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm.

Figure 2:
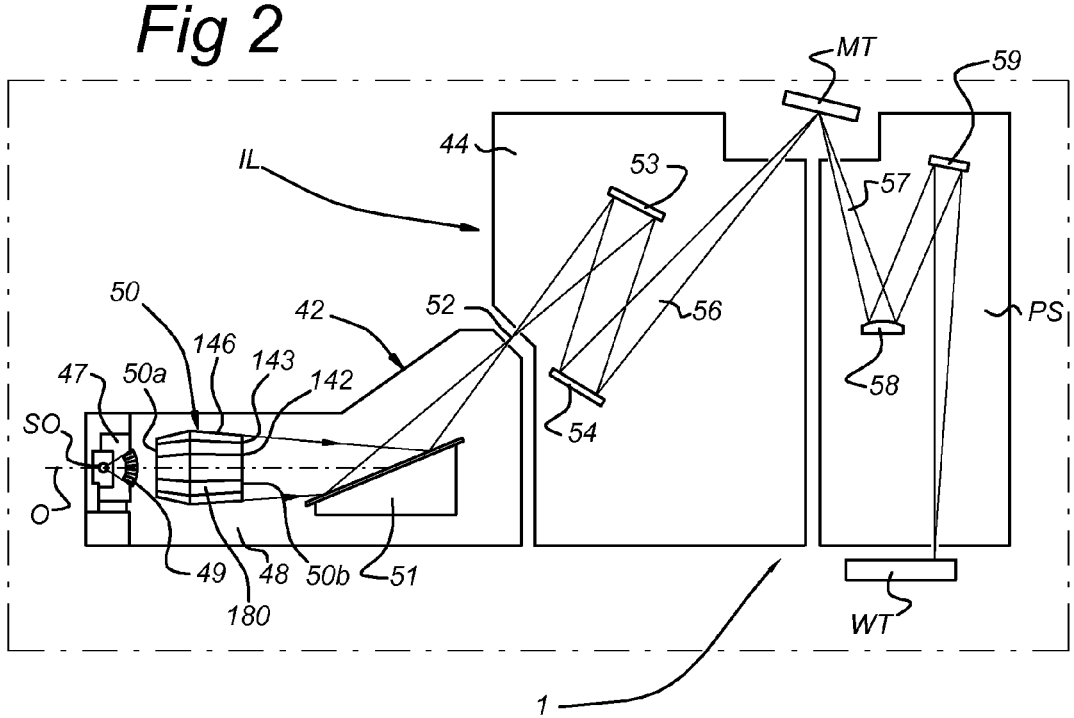
FIG. 2 schematically depicts a side view of an EUV illumination system and projection optics of a lithographic projection apparatus according to an embodiment of FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. In an embodiment, a Sn source as an EUV source is applied. The radiation emitted by radiation source SO is passed from a source chamber 47 into a collector chamber 48 via an optional gas barrier or contaminant trap 49 (also indicated as contaminant barrier or foil trap) which is positioned in or behind an opening in source chamber 47. The contaminant trap 49 may comprise a channel structure. Contamination trap 49 may also comprise a gas barrier or a combination of a gas barrier and a channel structure. The contaminant trap or contaminant barrier 49 further indicated herein at least comprises a channel structure, as known in the art.

The collector chamber 48 includes a radiation collector 50 (herein also indicated as collector mirror) which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present in additional to 58, 59. Radiation collectors 50 are known from the prior art.

Instead of a grazing incidence mirror as collector mirror 50, a normal incidence collector may be applied. Collector mirror 50, as described herein in an embodiment in more detail may be a nested collector with reflectors 142, 143, and 146, and as schematically depicted in amongst others FIG. 2 is herein further used as example of a collector (or collector mirror). Hence, where applicable, collector mirror 50 as a grazing incidence collector may also be interpreted as collector in general and in an embodiment also as a normal incidence collector.

Further, instead of a grating spectral filter 51, as schematically depicted in FIG. 2, a transmissive optical filter may be applied, or in an embodiment, no filter may be used at all. Optical filters transmissive for EUV and less transmissive for or even substantially absorbing UV radiation are known in the art. Hence, "grating spectral purity filter" is herein further indicated as "spectral purity filter" which includes gratings or transmissive filters. Not depicted in FIG. 2, but also included as optional optical elements may be EUV transmissive optical filters, for instance arranged upstream of collector mirror 50, or optical EUV transmissive filters in illumination unit 44 and/or projection system PS.

In an embodiment (see also above), radiation collector 50 may be a grazing incidence collector. The collector 50 is aligned along an optical axis O. The source SO or an image thereof is located on optical axis O. The radiation collector 50 may include reflectors 142, 143, 146 (also known as a Wolter-type reflector comprising several Wolter-type reflectors). Sometimes they are also called shells. These reflectors (or shells) 142, 143, 146 may be nested and rotationally symmetric about optical axis O. In FIG. 2 (as well as in other Figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Typically, this volume within outer reflector(s) 146 is circumferentially closed, although small openings may be present. All the reflectors 142, 143 and 146 include surfaces of which at least part includes a reflective layer or a number of reflective layers. Hence, reflectors 142, 143 and 146 (more reflectors may be present and embodiments of radiation collectors (also called collector mirrors) 50 having more than 3 reflectors or shells are comprised herein), are at least partly designed for reflecting and collecting EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers.

The radiation collector 50 is typically placed in the vicinity of the source SO or an image of the source SO. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143.

Referring to FIGS. 1 and 2, sensors in the lithographic apparatus 1, i.e. internal sensor, may be anywhere in the lithographic apparatus 1, such as in the, radiation system 42, the illumination unit 44 and/or projection system PS, etc. It would be superfluous to draw all possible sensors and sensor positions, which are known to the person skilled in the art, but by way of example, two position sensors IF1 and IF2 are depicted in FIG. 1. Such sensors can be used for alignment of the mask MA or the wafer W. As mentioned above, the sensor may for instance be a wafer stage sensor, a mask stage sensor, a detector sensor, a collector sensor, an illuminator sensor, a position sensor (such as position sensors IF1 and IF2), an energy sensor, etc. The sensor may be arranged to measure alignment, illumination, position, etc. In an embodiment the sensing surface of the sensor comprises ruthenium.

Figure 3A:
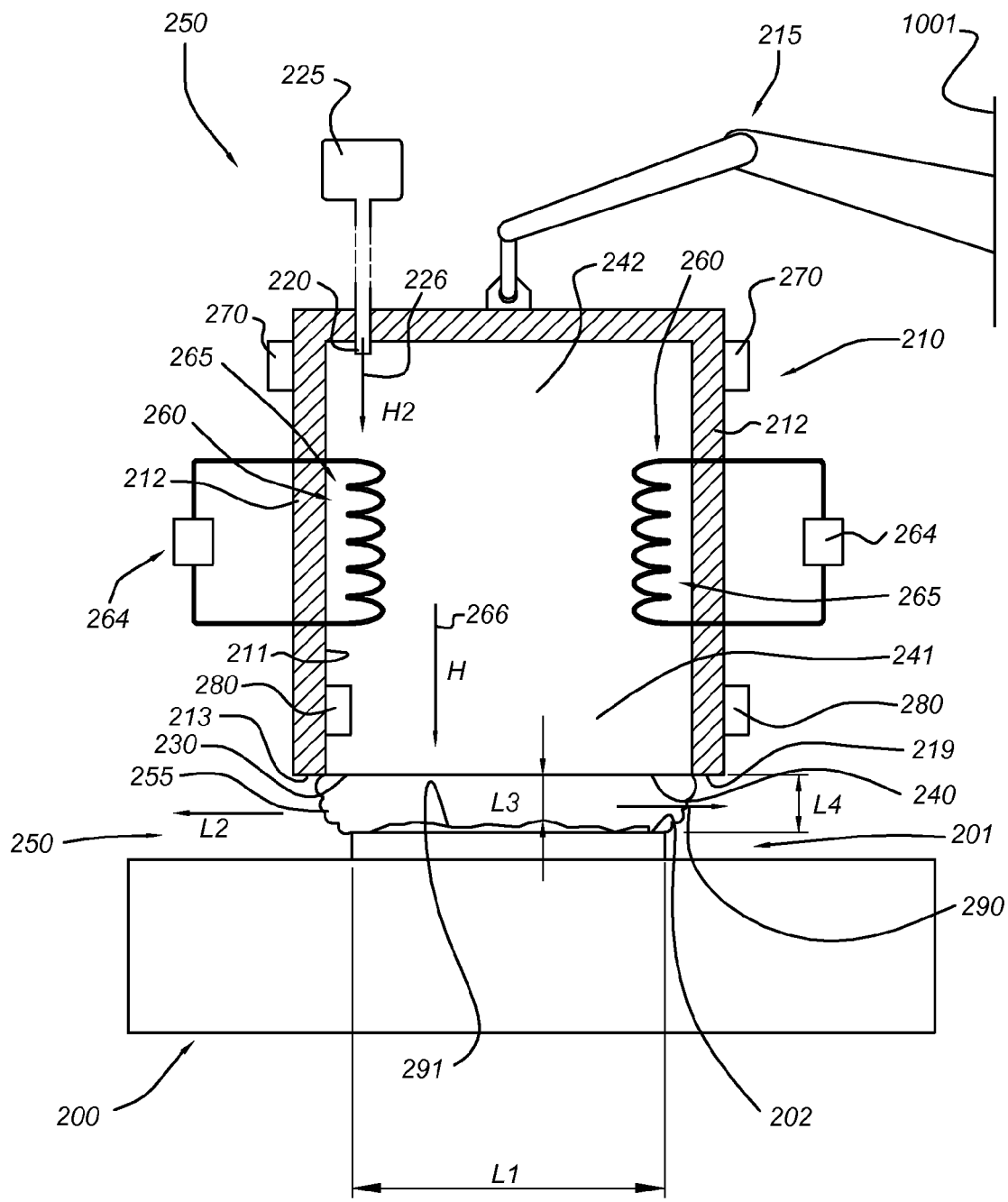
FIGS. 3a-3e schematically depict embodiments and variations thereon of a mini-reactor as part of the lithographic apparatus of FIG. 1.
Figure 3B:
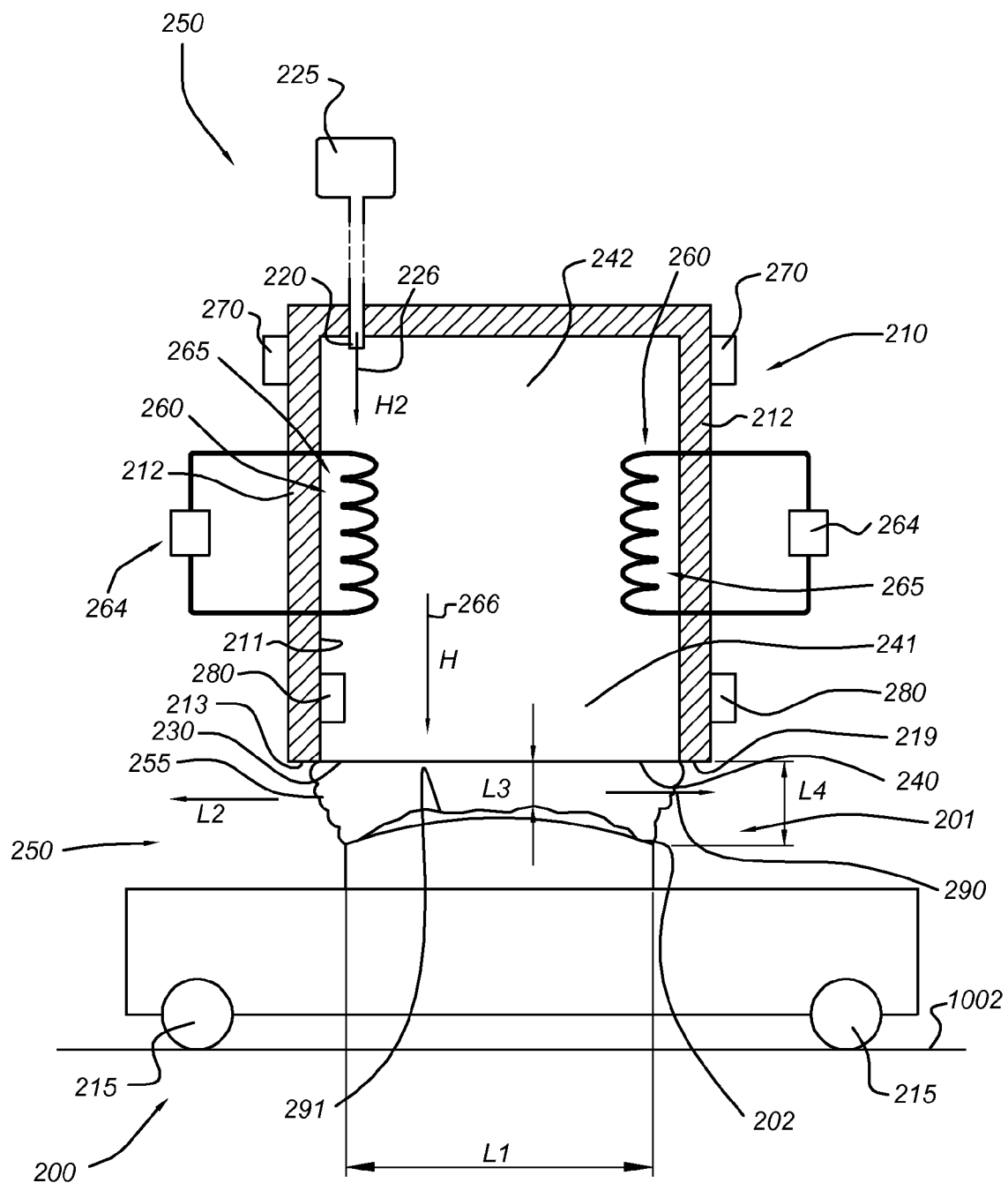
Figure 3C:
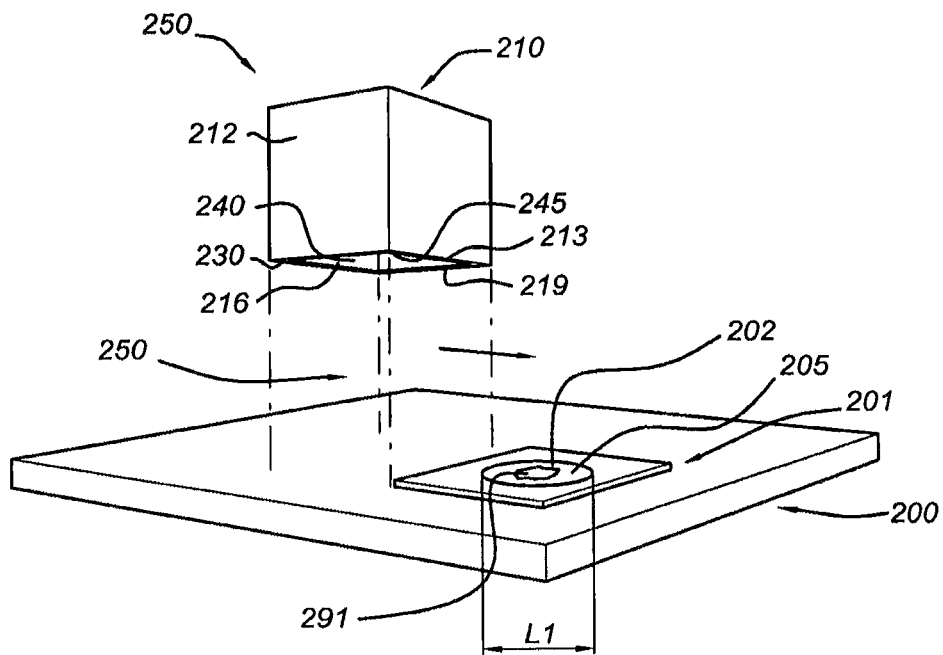
Figure 3D:
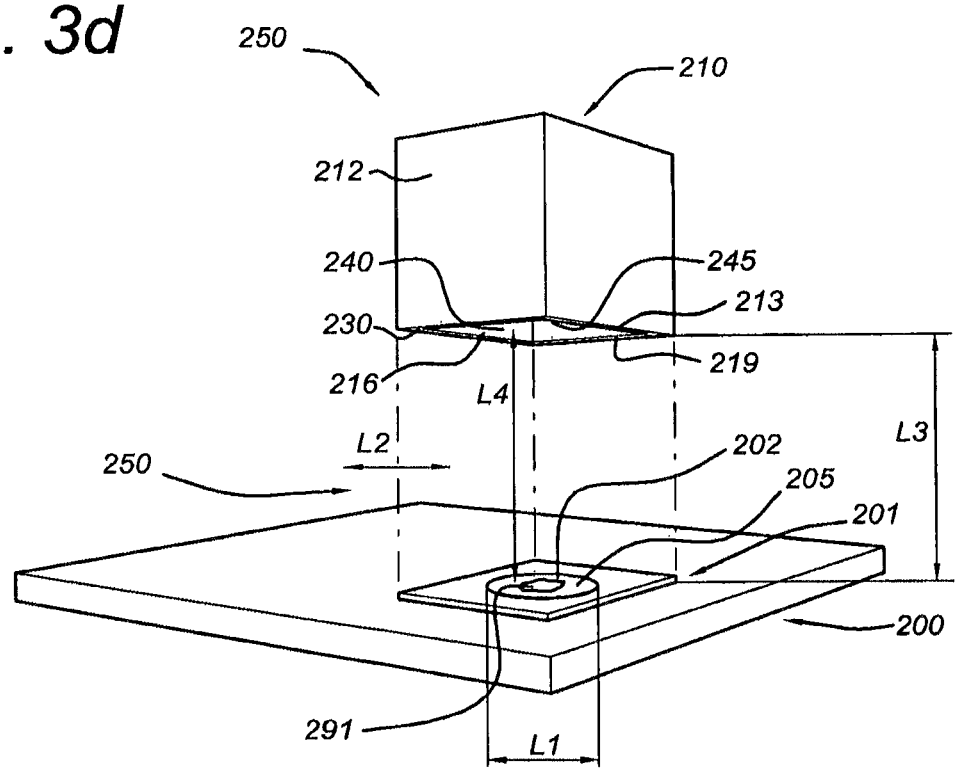
Figure 3E:
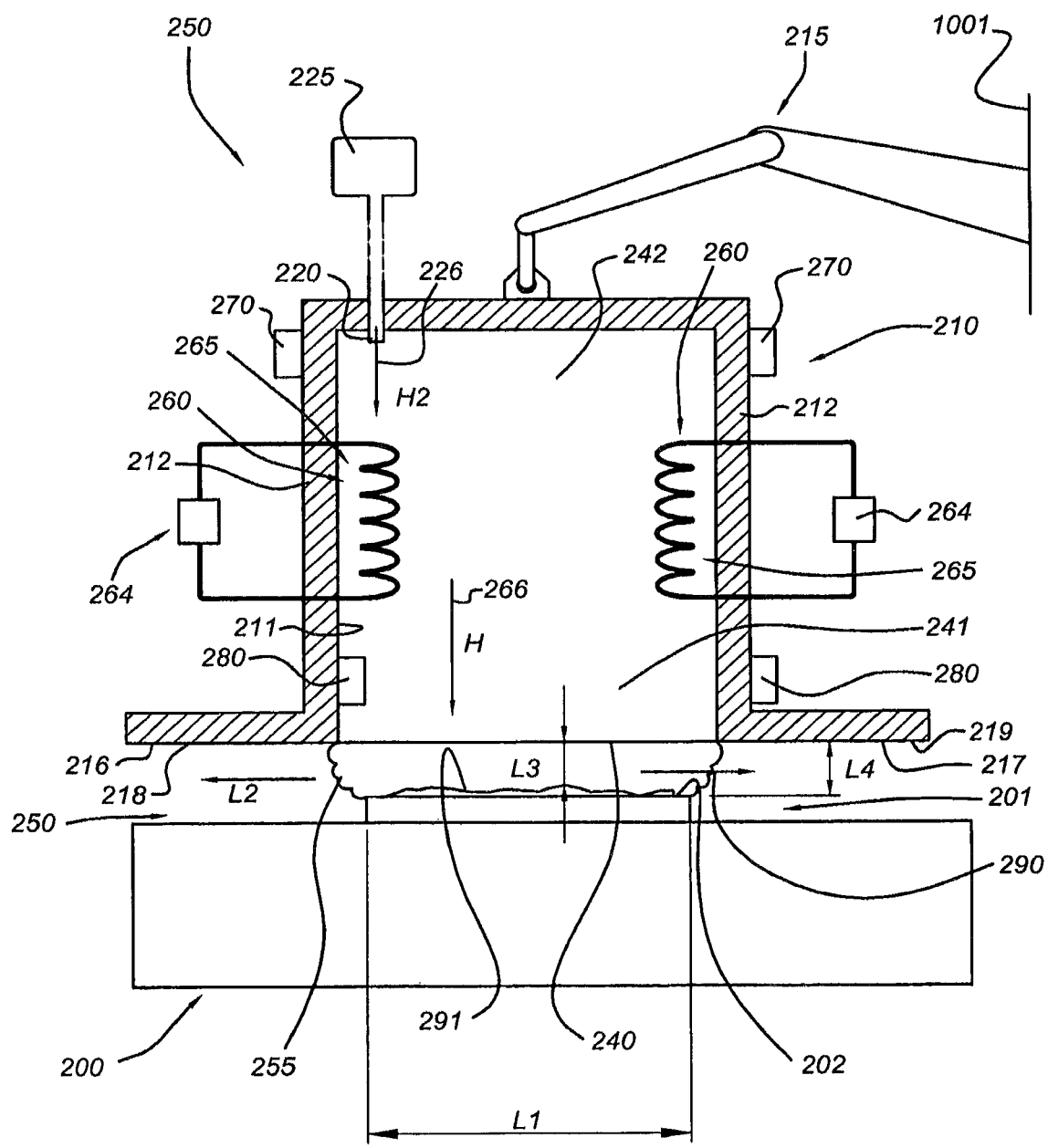

FIG. 3a, and FIG. 3b in more detail, schematically depict in side view a sensor 201 with a sensing surface 202. FIGS. 3c and 3d schematically depict a perspective view; here, the mini-reactor (see below) is not arranged over the sensing surface 202 during a stage I (FIG. 3c) and arranged over the sensing surface 202 during a stage II (FIG. 3d). In stage II, the method for treating the sensing surface 202 according to the invention may be applied. FIG. 3e schematically depicts an alternative embodiment, related to the embodiment depicted in FIG. 3a, wherein the mini-reactor has an extended edge (see below).

Embodiments of the invention are now further described with specific reference to FIGS. 3a-3e.

The sensing surface 202 may substantially flat, but may also be concave or convex (see also FIG. 3b). The sensor 201 is arranged somewhere in the lithographic apparatus 1, i.e. it is an internal sensor. To illustrate the sensor 201 in its context, a support for the sensor, such as a wall, a mask table, wafer table, mirror, etc., is indicated with reference 200. The sensing surface 202 may be subject to carbonaceous deposition, also indicated as carbon containing deposition, indicated with reference 291, such as carbon deposition or hydrocarbon deposition. Such carbon containing deposition 291 may be formed due to the use of pumps, lubricants, resists, etc. in the lithographic apparatus 1 or for lithographic processing. Deposition 291 may also be indicated as debris. The carbon containing deposition 291 appears to be at least partly removable by hydrogen radicals, indicated with H*, which may lead to the formation of volatile hydrocarbons, such as methane. These may be pumped away by one or more pumps (not drawn), which may be arranged to maintain a sub-atmospheric pressure in the lithographic apparatus 1 (during lithographic processing).

A potential disadvantage of using hydrogen radicals may be that they react also with other materials present in the lithographic apparatus 1. The lithographic apparatus 1 may comprise tin (Sn), for instance in solder, or zinc (Zn), for example as trace element in stainless steel, and also Sn, for instance Sn deposition due to a Sn source. When hydrogen radicals are released, they may also react with other metals or metal oxides, thereby possibly forming metal hydrides, such as $ZnH_2$ or $SnH_4$, etc., which may redeposit on optical elements. Such a process may be called "hydrogen induced outgassing". This is not desired. Hence, it is desired to remove carbon containing depositions 291 from sensing surface(s) 202, while not subjecting other surfaces present in the lithographic apparatus, especially Zn or Sn containing surfaces, to hydrogen radicals. Another potential benefit of the invention is that since not all parts of the lithographic apparatus 1 are compliant to atomic H and since with the invention the radicals may not substantially move out of the mini-environment, now the material compliance may be less or not an issue.

Therefore, the invention provides an embodiment of the lithographic apparatus 1 which comprises such internal sensor 201 and additionally a mini-reactor 210, wherein the sensor 201, or the mini-reactor 210, or the sensor 201 and the mini-reactor 210 are transportable. The mini-reactor 210 may comprise an inlet 220 for a hydrogen containing gas 226, a hydrogen radical generator 260, and an outlet 230 for a hydrogen radical containing gas 266. As will be clear to the person skilled in the art, the terms "inlet" and "outlet" may also refer to a plurality of inlets and a plurality of outlets, respectively. The mini-reactor 210 is especially arranged to create, during use of the mini-reactor 210 in the method for treating the sensing surface 202 of the sensor 201 according to an embodiment of the invention, a local mini-environment 255 comprising hydrogen radicals to the sensing surface 202 for treating the sensing surface 202. In an embodiment, the mini-reactor 210 may be arranged to purge the sensing surface 202 of the sensor 201. Advantageously, volatile hydrides are in this way moved out of the mini-environment 255 and exhausted, thereby substantially preventing deposition of the volatile hydrides on the sensing surface 202. The gas flow of the hydrogen radical containing gas 266 can be pulsed or continuous.

In this way, the sensing surface 202, and especially substantially only the sensing surface 202, can be treated with the hydrogen radicals, without substantially subjecting other items of the lithographic apparatus 1 to the hydrogen radicals, since the mini-reactor 210 and the sensor 201, more especially the sensing surface 202, are arranged the one over the other (or vice versa). Therefore, the term "mini environment" is used herein.

Devices and methods known in the art can be used to transport the sensor 201 from a position for sensing to a position for treating, or vice versa, wherein the mini-reactor 210 is transported to the sensor 201, or both can be transported to each other. Such devices may include transporters including rails, movable arms, telescope arms, wafer stages, mask stages, etc. By way of example, in FIG. 3a, a transporter 215 is schematically depicted, which in this embodiment allows transport of the mini-reactor 210. The transporter 215 may for instance be a telescope arm. In the schematically depicted embodiment, the transporter is connected to a lithographic apparatus wall 1001. Here, the transporter 215 is depicted to be arranged to transport the mini-reactor 210. However, also a transporter 215 may applied to transport the sensor 201, or both a transporter 215 for transporting the mini-reactor 210 and a second transporter 215 for transporting the sensor 201 may be applied.

In FIG. 3b, the schematically depicted transporter 215 comprises wheels, allowing the sensor 201, or in fact the support 200 on which the sensor 201 is located, to be transported. Here, the transporter 215 may transport for instance over lithographic apparatus bottom 1002.

The mini-reactor 210 comprises the hydrogen radical generator 260, i.e. within the mini-reactor 210 at least part of the total amount of hydrogen molecules from the hydrogen containing gas 226 are converted into hydrogen radicals, i.e. a hydrogen radical containing gas 266. The hydrogen radical generator 260 may comprises one or more hydrogen radical generators 260 selected from the group consisting of one or more oscillating field electrodes, a magnetron RF generator and one or more hot (i.e. heatable) filaments. In a specific embodiment, the hydrogen radical generator 260 comprises a filament arranged to be heated in order to convert molecular hydrogen into hydrogen radicals.

FIGS. 3a-3b schematically such embodiment, wherein the filament is indicated with reference 265. In an embodiment, the filament 265 can be e.g. a W (tungsten) or Ta (tantalum) wire or coil (or another material known to the person skilled in the art), which can be heated to e.g. about 1500-3000° K or even above, depending upon the kind of material and desired temperature and required temperature to dissociate the chemical bonds of $H_2$ of at least part of all $H_2$ molecules in the $H_2$ containing gas 100.

In an embodiment, the hydrogen radicals may be provided by leading a hydrogen containing gas 226 along the hot filament, thereby producing the hydrogen radical containing gas 266. In an embodiment, the hydrogen containing gas 226 comprises one or more gasses selected from the group consisting of $H_2$, HD, $D_2$, HT, DT, and $T_2$. Herein, the term "hydrogen containing gas" refers to a gas comprising hydrogen molecules (i.e. $H_2$ and analogues thereof). The term "hydrogen radical containing gas" refers to a gas comprising hydrogen radicals (i.e. H and analogues thereof). Analogues of the hydrogen atom or hydrogen radical comprise D (deuterium) and T (tritium) and analogues of $H_2$ comprise $D_2$, $T_2$, HD, TD, and HT. For the sake of simplicity, $H_2$ (including analogues thereof) and H (including analogues thereof) are further indicated as $H_2$ and H, respectively. Thus, $H_2$ may refer to one or more selected from the group consisting of $H_2$, $D_2$, $T_2$, HD, TD, and HT, and H may refer to one or more selected from the group consisting of H, D and T. Herein the term "hydrogen containing gas" especially relates to a gas comprising or consisting of such molecules, like in the case of a $H_2$-containing gas diluted $H_2$, such a mixture of $H_2$ and one or more noble gasses, such as for instance He. Herein the term "hydrogen radical containing gas" especially relates to a gas comprising such radicals, which gas further in general comprises $H_2$ and one or more noble gasses, such as for instance He.

At least part of this hydrogen radical containing gas 266 leaves mini-reactor 210 via outlet 230. The hydrogen radicals come into contact with the deposition 291 on the sensing surface 202, and the deposition, especially carbon containing deposition, may be removed. The off-gas, indicated with reference 290 (see FIG. 3b) may be exhausted by an exhaust (not depicted), either integrated with the mini-reactor 210, or arranged elsewhere.

Embodiments of the invention may provide that the local mini-environment 255 is substantially only provided to the sensing surface 202. In an embodiment, the method comprises at least partially cleaning the sensing surface 202 from carbon containing deposition 291, such as carbon deposition and/or hydrocarbon deposition. This may allow more freedom for the choice of materials, especially non-sensor materials, since those materials are substantially not subjected to hydrogen radicals (i.e. the radical containing gas). The local mini-environment 255 is created in the volume over the sensing surface 202, and not remote from the sensing surface 202. Hence, the environment of the sensor 201, indicated with reference 250, may substantially not contain or receive hydrogen radicals. It is noted that hydrogen radicals may (re)associate relatively quickly; hence, a local mini-environment 255 may created, containing hydrogen radicals, whereas the (further) environment, indicated with reference 250, does not substantially contain or receive hydrogen radicals. In this way, the environment 250 may not suffer from hydrogen induced outgassing and/or material degradation.

This is for instance indicated in FIGS. 3b-3d. When performing the treatment, the hydrogen radicals, i.e. the hydrogen radical containing gas 266 may substantially not migrate far away from the reactor 210. The distance the hydrogen radicals may move away from the mini-reactor 210 is indicated with reference L2, and may for instance be in the range of less than about 5 cm, such as 0-5 cm, or 0-2 cm, or even 0-1 cm. Hydrogen induced outgassing outside the mini-environment 255, will thereby be very limited. This does not mean that hydrogen gas may not diffuse further away, but such gas does not substantially contain hydrogen radicals anymore.

The migration of hydrogen radicals may especially be inhibited by applying external parts of the mini-reactor 210, especially of the reactor chamber, which may be arranged to be directed to part of the sensing surface 202 and/or its surroundings (i.e. environment 250), may comprise a material having a hydrogen radical surface recombination coefficient of about >0.02, or about >0.1 (see also below). Hence, by applying such parts, hydrogen radical recombination may be promoted, and thus transport of hydrogen radicals (further) into the lithographic apparatus 1 may be reduced and the local mini-environment may be maintained locally (to the sensing surface 202).

The hydrogen containing gas may be provided by a source 225, which may be within or external from the lithographic apparatus 1. Further, assuming a filament 265 that can be heated, a voltage source 264 may be provided, which may also be within or external from the lithographic apparatus 1.

In an embodiment, the mini-reactor 210 may comprise a reactor chamber 241 with a chamber opening 240. This chamber opening 240 may at least partly coincide with the outlet 230. However, the hydrogen radical generator 260 may also be arranged in a separate chamber comprised in the mini-reactor 210. For instance, the mini-reactor 210 may consist of one or more chambers; for instance two chambers. In the schematic drawings, only one chamber is indicated. However, the mini-reactor 210 may for instance comprise a hydrogen radical generating chamber with outlet 230, the hydrogen radical generating chamber arranged to generate the hydrogen radicals, and downstream thereof a chamber arranged to receive, via outlet 230, at least part of the total number of hydrogen radicals generated in the hydrogen radical generating chamber and arranged create the mini-environment 255 to the sensing surface 202. Such embodiment is not depicted. Hence, in an embodiment the outlet(s) 230 are arranged to provide, during use of the mini-reactor 210 in the treatment method, the hydrogen radical containing gas 266 to the sensing surface 202 of the sensor 201, especially when the outlet(s) 230 substantially coincides with the reactor chamber opening 240, as depicted in the schematic drawings. However, the outlet(s) 230 may in an embodiment also be arranged to provide, during use of the mini-reactor 210 in the treatment method, the hydrogen radical containing gas 266 to a separate reactor chamber 241, downstream of the outlet(s). Then, from the reactor chamber 241, the hydrogen radical containing gas 266 may be provided via reactor chamber opening 240 to the sensing surface 202 of the sensor 201 (this embodiment is not depicted).

In the embodiments schematically depicted in FIGS. 3a and 3b, the mini-reactor 210 comprises reactor chamber 241, wherein the reactor chamber 241 also comprises the hydrogen radical generator 260, and wherein the outlet 230 substantially coincides with the reactor chamber opening 240. The reactor 210, and in this embodiment also reactor chamber 241, have walls 212, with internal surface 211.

Here, the reactor chamber 241 is especially arranged such that, when the sensor 201 and the mini-reactor 210 are arranged for treatment, the reactor chamber opening 240 of the reaction chamber 241 is directed to the sensing surface 202. Such reactor chamber opening 240 may be arranged to be moved to a position in a vicinity of the sensing surface 202, or the sensing surface 202 may be arranged to be moved to a vicinity of the reactor chamber opening 240, or both the reactor chamber opening 240 and the sensing surface 202 may be arranged to move to respective positions in which they are in each other's vicinity.

When the reactor chamber opening 240 and the sensing surface 202 are suitably located in each other's vicinity, a configuration is obtained in which the method of treating the sensing surface 202 can be applied, especially within the volume substantially enclosed by the reactor chamber 241 and sensing surface 202. This configuration is schematically depicted in FIGS. 3a and 3b; in FIG. 3c, the sensor 201 and mini-reactor 210 are offset (such as for instance may be the case before or after performing the method for treating the sensing surface 202 according to the invention), which is indicated with stage I, and are brought to positions in each other's vicinity (either by moving the mini-reactor 210, by moving the sensor 201, or by moving both) in stage II (FIG. 3d), which can also be indicated as treatment stage, i.e. the stage wherein the sensing surface 202 is treated according to the method of the invention. The volume substantially enclosed by the reactor chamber 241 and sensing surface 202 is indicated with reference 242.

The sensing surface 202 may have a sensing surface area or a sensing surface cross section area, indicated with reference 205 (see FIGS. 3c and 3d). When the sensing surface 202 is substantially flat, as in FIG. 3a, the sensing surface area is applied; when the sensor is for instance convex, as in FIG. 3b, or concave, the sensing surface cross section is applied. These are both indicated with reference 205. The area will in general be in the range of about 1 mm$^2$-100 cm$^2$. Note that the term sensor 201 may also include a plurality of sensors 201, such as a sensor array. Further, the reactor chamber opening 240 may have a chamber opening area. This chamber opening area is indicated with reference 245 (FIGS. 3c and 3d). When the reactor chamber opening area 245 is smaller than the sensing surface area or a sensing surface cross section area 205, the sensing surface 202 may be cleaned by "scanning" the sensing surface 202, i.e. arranging the reactor chamber opening 240 at different positions over the sensing surface 202. Again, this may be performed by transporting the sensor 201, or the mini-reactor 210 or by both moving the sensor 201 and the mini-reactor 210.

Note that the term "over" herein does not imply that the mini-reactor 210 is above the sensing surface 202, but rather that the sensing surface 202 and the mini-reactor 210, or the reactor chamber opening 240 are close to each other and the sensing surface 202 is reachable by the hydrogen radical containing gas 260, for instance at a distance of less than about 2 cm, such as 0.2-2 cm, or at a distance less than about 1 cm, such as 0.2-1 cm. These distances apply to the shortest distance between reactor chamber opening 240 and the sensing surface and the shortest distance between the mini-reactor 210 and the sensing surface 202, which are indicated with references L3 and L4, respectively, and which are in FIGS. 3a-3e substantially identical.

In FIGS. 3a, 3b and 3e, the mini-reactor 210 is on top, but these side views may be rotated any rotation in the range of 0-360° (in the plane of drawing), and still represent possible arrangements according to the invention.

The reactor chamber opening area 245 may be substantially equal to or larger than the sensing surface area or the sensing surface cross section area 205. In such embodiments, it may be possible that the reactor chamber 241 may even partially enclose the sensing surface 202. Especially when the chamber opening area 245 has the above dimensions or is smaller than the sensing surface area or the sensing surface cross section area 205, the mini-environment 255 may be created substantially only to the sensing surface 202. In an embodiment, the mini-reactor 210 is arrangeable to create the local mini-environment 255 substantially only to the sensing surface 202. Therefore, the ratio of reactor chamber opening area 245 and the sensing surface area or the sensing surface cross section area 205 is especially in the range of about 0.2-2, or about 0.5-2, or in the range of about 0.5-1.5, or in the range of about 0.5-1.2. The ratio of reactor chamber opening area 245 and the sensing surface area or the sensing surface cross section area 205 may be in the range of about 1-2, or about 1.05-2, or in the range of about 1.1-1.5, or in the range of about 1.1-1.2.

When the sensing surface area or the sensing surface cross section area 205, or when the sensor 201 (i.e. sensor cross section) is smaller than the reactor chamber opening area 245, the chamber opening 240 may at least partly slide over the sensing surface 202 or sensor 201. In FIG. 3b, this would imply that the mini-reactor 210 moves (further) in the direction of the support 200, until even substantially enclosing the sensing surface 202.

The lithographic apparatus 1 may in an embodiment further comprise a cooling element, indicated with reference 270, arranged to cool at least part of the mini-reactor 210. In this way, the internal surface(s) 211 of the reactor wall 212, especially of the reactor walls of the reactor chamber 241, may be cooled. This may be beneficial for protecting this wall. It may further beneficial for deposition of hydrocarbons off-gassed from the sensing surface 202 during the treatment according to the invention. This may also allow the effect of the cleaning action on thermal stability of the lithographic apparatus 1 and/or its elements to be limited, i.e. the impact of the treatment to the environment 250 of the mini-reactor 210 may be limited.

In a specific embodiment, the internal surface 211 of the reactor walls 212, especially of the reactor chamber 241, may comprise a material that does substantially not react with hydrogen or with hydrogen radicals or with both hydrogen and hydrogen radicals, especially at the treatment conditions. For instance, such walls 212, or especially the surfaces 211, may consist of aluminum or stainless steel. In an embodiment, the internal surface 211 of the reactor chamber 241 may comprise a material having a hydrogen radical surface recombination coefficient of about ≤0.02, and in a variant a hydrogen radical surface recombination coefficient≤0.001. Using such a material or combination of materials that fulfill this criterion appear to provide a decrease in hydrogen radical recombination compared to materials having a hydrogen radical surface recombination coefficient>0.02. Information on recombination coefficients can be found in the literature, in particular W. V. Smith, "The surface recombination of H atoms and OH radicals", J. Chem. Phys. 11, 110-125 (1943) and B. J. Wood, H. Wise, "Kinetics of Hydrogen Atom Recombination on Surfaces", J. Phys. Chem. 65, 1976-1983 (1961). In an embodiment, walls 212 may comprise stainless steel or aluminum, and in a specific embodiment, the wall 212 comprise stainless steel or aluminum with a coating (i.e. in an embodiment internal surface 211) with a low radical surface recombination coefficient, such as quartz or $Si_3N_4$ or other materials described below or known to the person skilled in the art. In an embodiment, external parts, indicated with reference 219, of the mini-reactor 210, especially of the reactor chamber 241, which may be arranged to be directed to part of the sensing surface 202 and/or its surroundings, such as substrate 200, may comprise a material having a hydrogen radical surface recombination coefficient of about >0.02, or about >0.1.

An example is depicted in FIGS. 3c-3e. In FIGS. 3c and 3d, the edge of walls 212 (as external part 219), arranged to be directed to the sensing surface 202 during performing the method of treating the sensing surface 202 (i.e. the part of the wall 212 arranged most downstream), indicated with reference 213, comprises such material with a relatively high radical surface recombination 216 (as coating or external surface), i.e. with a surface recombination coefficient of at least about 0.02.

In FIG. 3e, the walls 212 have an extending edge 217 (as external part 219), thereby creating a kind of "hat shape", wherein a downstream surface of the extending edge, indicated with reference 218, comprises such material 216 with a relative high radical surface recombination. Again, also extending edge downstream surface 217 is arranged to be directed to the sensing surface 202 during performing the method of treating the sensing surface 202.

The following Table 1 illustrates a number of materials and their respective surface recombination coefficients for hydrogen radicals.

TABLE 1

Hydrogen surface recombination coefficient γ for various materials (in the range of about 300-800 K.).

| Material | Surface recombination coefficient |
| --- | --- |
| Quartz (room temperature) | $7.0 \times 10^{-4}$ |
| Quartz (300-500° C.) | $3 \times 10^{-3}$ |
| Pyrex glass | $4 \times 10^{-3}$ |
| Teflon | $\sim 4 \times 10^{-4}$ |
| Fused silica | $\sim 6 \times 10^{-4}$ |
| Si | $\sim 1 \times 10^{-3}$ |
| $Si_3N_4$ | $\sim 1 \times 10^{-3}$ |
| W | 0.06 |
| $K_2SiO_3$ | 0.07 |
| Pd | 0.08 |
| Cu | 0.1 |
| Ni | 0.2 |
| $Al_2O_3$ | 0.33 |
| Ti | 0.4 |
| $ZnO \cdot Cr_2O_3$ | 0.6 |
| Pt | 1 |
| Ru | $\sim 0.1$ |
| Sn | 0.03 |
| Al | $\sim 0.3$ |

The $H_2$ partial pressure in the mini-reactor 210, especially within the reactor chamber 241, may be in the range of about 0.1-100 Pa and the hydrogen radical partial pressure may be in the range of about $1.10^{-5}$ to 10 Pa, such as in the range of $1.10^{-4}$ to 1 Pa. Thus, within the local mini-environment 255, also the $H_2$ partial pressure may be in the range of about 0.1-100 Pa and the hydrogen radical partial pressure may be in the range of about $1.10^{-5}$ to 10 Pa, such as in the range of $1.10^{-4}$ to 1 Pa.

The invention also provides a method for treating sensing surface 202 of the internal sensor 201 of a lithographic apparatus, such as, but not limited to, the lithographic apparatus 1 described herein, wherein the method comprising providing the local mini-environment 255 comprising hydrogen radicals to the sensing surface 202 and treating the sensing surface 202 with the hydrogen radicals. Hence, the invention also provides an in situ method for the treatment, especially cleaning from carbonaceous deposition, of the sensing surface 202 of the sensor 201.

The method may further comprise evaluation of a treatment result, for instance by evaluating the off-gas from the sensing surface 202. For instance a mass spectrometer may detect hydrocarbon(s). When a predetermined lower limit of hydrocarbon(s) is reached, the treatment may be terminated. Hence, the lithographic apparatus 1 may further comprise a treatment sensor arranged to evaluate the treatment result. Such treatment sensor is schematically depicted in FIGS. 3a and 3b with reference 280.

The method may further comprise evaluating (with a sensor such as an embodiment of sensor 280) the treated sensing surface 202. Depending upon the evaluation, the treatment may be continued, for instance until a certain predetermined result is obtained, such a predetermined reflection or refraction value of light impinging on the sensing surface 202, or the treatment may be terminated (or instance when the certain predetermined result is obtained), and for instance lithographic processing (i.e. the manufacturing of devices) may be continued. Alternatively, the treatment may be terminated after a predefined time (for instance defined after a calibration).

The method of treating the sensing surface 202 may be applied before or after manufacturing devices with the lithographic apparatus 1. However, the invention also provides in a further aspect a device manufacturing method using for instance the lithographic apparatus 1 as described herein, wherein while manufacturing the device, during a manufacturing stage that the sensor 201 is not being used during the device manufacturing method, a method for treating the sensing surface 202 of the sensor 201 is applied, wherein the method comprises providing a local mini-environment 255 comprising hydrogen radicals to the sensing surface 202 and treating the sensing surface 202 with the hydrogen radicals. Hence, as mentioned above, the invention also provides an in situ method for the treatment, especially cleaning from carbonaceous deposition, of the sensing surface 202 of the sensor 201.

FIGS. 3c and 3d for instance schematically depict a perspective view of the sensor 201 and the mini-reactor 210, while being in an offset stage I (FIG. 3c), for instance because the sensor 201 is being used while manufacturing devices, such as while aligning, or being in a treatment stage II (FIG. 3d). In this schematic drawing of this embodiment, the sensor 201, or more especially, the sensing surface 202 is by way of example substantially round. The dimensions, such as length/width or diameter of the sensing surface 202, are indicated with L1, and may be such that the sensing surface area 205 will in general be in the range of about 1 $mm^2$-100 $cm^2$ (see also above). When the sensor 201 is not being used during the device manufacturing method (i.e. lithographic processing), for instance after aligning, the sensor 201 or the mini-reactor 210 or both the sensor 201 and the mini-reactor 210 may be transported, such that the mini-reactor 210 is arranged over the sensing surface 202. Then, the method of treating the sensing surface 202 may be applied and the sensing surface 202 may be cleaned from carbon containing compounds.

The distance the hydrogen radicals may move away from the mini-reactor 210, or more especially the sensing surface 202, is indicated with reference L2, and may for instance be in the range of less than about 5 cm, such as 0-5 cm, or 0-2 cm, or even 0-1 cm. Hydrogen induced outgassing outside the mini-environment 255, will thereby be limited (and may even be reduced by applying the above mentioned material having a relatively high surface hydrogen radical combination coefficient). This does not mean that hydrogen gas may not diffuse further away, but such gas does not substantially contain hydrogen radicals anymore. Furthermore, the gaseous gas product may not substantially move back to the sensing surface to be redeposited. Thereby, the environment 250 of the sensor 201 (here for instance support 200), is substantially not subjected to hydrogen radical reactions, which makes the choice of the materials present in the environment 250 of the sensor 201 less difficult.

In a specific embodiment, the lithographic apparatus 1 comprises a source of radiation constructed to generate EUV radiation wherein the source of radiation is a Sn plasma source. Herein, the term "constructed to generate EUV radiation" especially refers to sources which are designed to generate EUV radiation and which are designed to be used in EUV lithography. In specific variants, the source of radiation comprises a laser produced plasma source (LPP) or a discharge produced plasma source (Sn plasma sources), respectively.

The lithographic apparatus 1 comprises in an embodiment an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate. In a variant the lithographic apparatus 1 is an EUV lithographic apparatus 1. The lithographic apparatus 1 comprises a source of radiation constructed to generate the radiation beam, which in an embodiment especially is a EUV radiation beam, and the source of radiation is constructed to generate EUV radiation.

Hence, the invention provides in an embodiment lithographic apparatus 1 with an internal sensor 201. The lithographic apparatus 1 further has mini-reactor 210. The sensor 201, or the mini-reactor 210, or the sensor 201 and the mini-reactor 202 are transportable. The sensor 201 has sensing surface 202. The mini-reactor 210 comprises inlet for hydrogen containing gas, hydrogen radical generator, and outlet for hydrogen radical containing gas. The mini-reactor 210 is arranged to create, during use of the mini-reactor 210 in a method for treating the sensing surface 202 of the sensor 201, local mini-environment comprising hydrogen radicals to the sensing surface 202 for treating the sensing surface 202. In this way, the sensing surface 202 can be locally cleaned, without substantial impact on the environment of the sensing surface 202. Therefore, in an embodiment, the method and the min-reactor 210 according to embodiments of the invention allow creating the mini-environment 255 to the sensing surface 202, while at the same time diminishing or even prevention exposure of other parts of the lithographic apparatus 1 to hydrogen radicals (i.e. the hydrogen radical containing gas 266).

The term "substantially" herein refers in an embodiment to "completely". In another embodiment, especially when relating to values, it may for instance refer to about 95-100%. The person skilled in the art understands the term "substantially". Likewise, the term "at least partially" herein refers in an embodiment to "completely". In another embodiment, it may for instance refer to about 95-100%. The term "comprise" includes also embodiments wherein the term "comprises" means "consists of".

Although specific reference may be made in this text to the use of lithographic apparatus 1 in the manufacture of ICs, it should be appreciated that the lithographic apparatus 1 described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, etc.

The descriptions above are intended to be illustrative, not limiting. Thus, it will be apparent to one skilled in the art that modifications may be made to the present invention as described without departing from the scope of the claims set out below. Use of the verb "to comprise" and its conjugations does not exclude the presence of elements or steps other than those stated in a claim. The article "a" or "an" preceding an element does not exclude the presence of a plurality of such elements. For instance, the term "a sensor 201" may therefore also relate in an embodiment to a plurality of (non-adjacent) sensors 201. In an embodiment, the mini-reactor 210 is also arranged to treat a plurality of sensing surfaces 202 of a plurality (non-adjacent) sensors 201, especially sequentially treating such surfaces 202, and therefore creating mini-environments 255 to each sensing surface 202, respectively.

The present invention is not limited to application of the lithographic apparatus 1 or use in the lithographic apparatus 1 as described in the embodiments. Further, the drawings typically only include the elements and features that are used to understand the present invention. Beyond that, the drawings of the lithographic apparatus 1 are schematic and not on scale. The present invention is not limited to those elements, shown in the schematic drawings. Further, the present invention is not confined to the lithographic apparatus 1 described in relation to FIG. 1 or 2. It should be appreciated that embodiments described above may be combined.

What is claimed is:

1. A lithographic apparatus comprising:
a projection system constructed and arranged to project a beam of radiation onto a target portion of a substrate;
an internal sensor having a sensing surface; and
a mini-reactor movable with respect to the sensor, the mini-reactor comprising
an inlet for a hydrogen containing gas,
a hydrogen radical generator, and
an outlet for a hydrogen radical containing gas,
the mini-reactor being constructed and arranged to create a local mini-environment comprising hydrogen radicals substantially only to the sensing surface to treat the sensing surface,
wherein the mini-reactor comprises a reactor chamber with a chamber opening, and wherein an internal surface of the reactor chamber comprises a first material that does substantially not react with hydrogen and hydrogen radicals, the first material having a hydrogen radical surface recombination coefficient of less than or equal to about 0.02, and wherein an external part of the mini-reactor comprises a second material having a hydrogen radical surface recombination coefficient of greater than about 0.02; and
a cooling element constructed and arranged to cool at least part of the mini-reactor.

2. The lithographic apparatus according to claim 1, wherein the mini-reactor is movable with respect to the sensor in order to create the local mini-environment substantially only to the sensing surface during use of the lithographic apparatus.

3. The lithographic apparatus according to claim 1, wherein the mini-reactor is movable with respect to the sensor in order for the mini-reactor to be brought in a vicinity of the sensor to create the mini-environment.

4. The lithographic apparatus according to claim 1, wherein the sensor comprises a sensor selected from the group consisting of a wafer stage sensor, a mask stage sensor, a detector sensor, a collector sensor, a collector frame sensor, an illuminator sensor, an illuminator frame sensor, a position sensor, and an energy sensor.

5. The lithographic apparatus according to claim 1, wherein the mini-reactor is arranged to purge the sensing surface of the sensor.

6. The lithographic apparatus according to a claim 1, wherein the sensing surface has a sensing surface area or a sensing surface cross-sectional area, wherein the reactor chamber opening has a chamber opening area, wherein the ratio of the reactor chamber opening area and the sensing surface area or the sensing surface cross-sectional area is in the range of about 0.2-2, and wherein the reactor chamber opening area is substantially equal to or larger than the sensing surface area or the sensing surface cross-sectional area.

7. The lithographic apparatus according to claim 1, further comprising a treatment sensor arranged to evaluate a result of the treatment.

8. The lithographic apparatus according to claim 1, wherein the first material comprises quartz or $Si_3N_4$.

9. The lithographic apparatus according to claim 1, wherein the second material comprises aluminum.

10. The lithographic apparatus according to claim 1, wherein the cooling element is constructed and arranged to cool the internal surface of the reactor chamber.

11. The lithographic apparatus according to claim 1, wherein the first material is a coating provided to walls of the reactor chamber.

12. The lithographic apparatus according to claim 1, wherein an external edge of a wall of the reactor chamber facing the sensing surface, in use, comprises the second material.

13. The lithographic apparatus according to claim 12, wherein the second material of the external edge is a coating.

\* \* \* \* \*